(12) United States Patent
Ni

(10) Patent No.: US 7,095,617 B1
(45) Date of Patent: Aug. 22, 2006

(54) PORTABLE COMPUTER PERIPHERAL APPARATUS WITH REINFORCED CONNECTING RING

(75) Inventor: Jim Ni, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/350,671

(22) Filed: Feb. 8, 2006

Related U.S. Application Data (63) Continuation-in-part of application No. 10/964,412, filed on Oct. 12, 2004.

(51) Int. Cl.
*H05K 5/02* (2006.01)

(52) U.S. Cl. ...................... 361/736; 361/752

(58) Field of Classification Search ............ 439/79; 361/737, 752; 257/679
See application file for complete search history.

(56) References Cited

U.S. PATENT DOCUMENTS

| | | | |
|---|---|---|---|
| 6,490,163 B1 * | 12/2002 | Pua et al. ................... 361/737 |
| 6,567,273 B1 * | 5/2003 | Liu et al. .................... 361/737 |
| 6,618,243 B1 | 9/2003 | Tirosh | |
| 6,763,410 B1 * | 7/2004 | Yu .............................. 710/74 |
| 6,804,749 B1 * | 10/2004 | Chien et al. ................ 711/115 |
| 6,900,988 B1 * | 5/2005 | Yen ............................ 361/737 |
| 6,908,038 B1 * | 6/2005 | Le ............................. 235/492 |
| 6,944,028 B1 * | 9/2005 | Yu et al. .................... 361/737 |
| 2003/0100203 A1 | 5/2003 | Yen | |
| 2004/0233645 A1 * | 11/2004 | Chen .......................... 361/737 |
| 2005/0164532 A1 * | 7/2005 | Ni et al. ....................... 439/79 |
| 2005/0181645 A1 * | 8/2005 | Ni et al. ....................... 439/79 |

* cited by examiner

*Primary Examiner*—Hung V. Ngo
(74) *Attorney, Agent, or Firm*—Bever, Hoffman & Harms, LLP; Patrick T. Bever (57) ABSTRACT

A computer peripheral device including a USB plug connector in which a reinforced connecting ring is mounted over the front flange of a one-piece or two-part housing, and includes an opening through which the USB plug connector protrudes. The connecting ring includes a collar that is sized to mount over the front flange using an interference fit, or a snap-coupled arrangement is used. The connecting ring also includes a front plate that protects a front of the housing from damage during use. An optional rear connecting ring is used to further secure a key ring and/or light-pipe device onto the housing.

17 Claims, 9 Drawing Sheets

PORTABLE COMPUTER PERIPHERAL APPARATUS WITH REINFORCED CONNECTING RING

CROSS-REFERENCE TO RELATED APPLICATIONS

The present application is a continuation-in-part of co-owned and co-pending U.S. application Ser. No. 10/964,412, filed Oct. 12, 2004, entitled "Portable Computer Peripheral Apparatus With Reinforced Connecting Ring", which is incorporated herein by reference in its entirety.

FIELD OF THE INVENTION

The present invention relates to computer peripheral devices and, in particular, it concerns a pocket-size computer peripheral devices that are connected with host computer systems by way of USB plug connectors.

BACKGROUND OF THE INVENTION

In the field of computers and computer peripheral devices, there is an ongoing trend towards miniaturization for convenience and portability. In certain cases, devices have been reduced to "pocket size", meaning that they can literally be carried in a user's pocket in the same manner as a wallet or set of keys.

One example of particular interest, in which context the present invention will be described herein, is a "flash disk", or "USB flash drive". For example, one product includes a pen-type flash device having a USB connector plug that can be connected to a USB port of a standard computer. The USB plug connector is protected by a removable cover when not in use.

Figure 12:
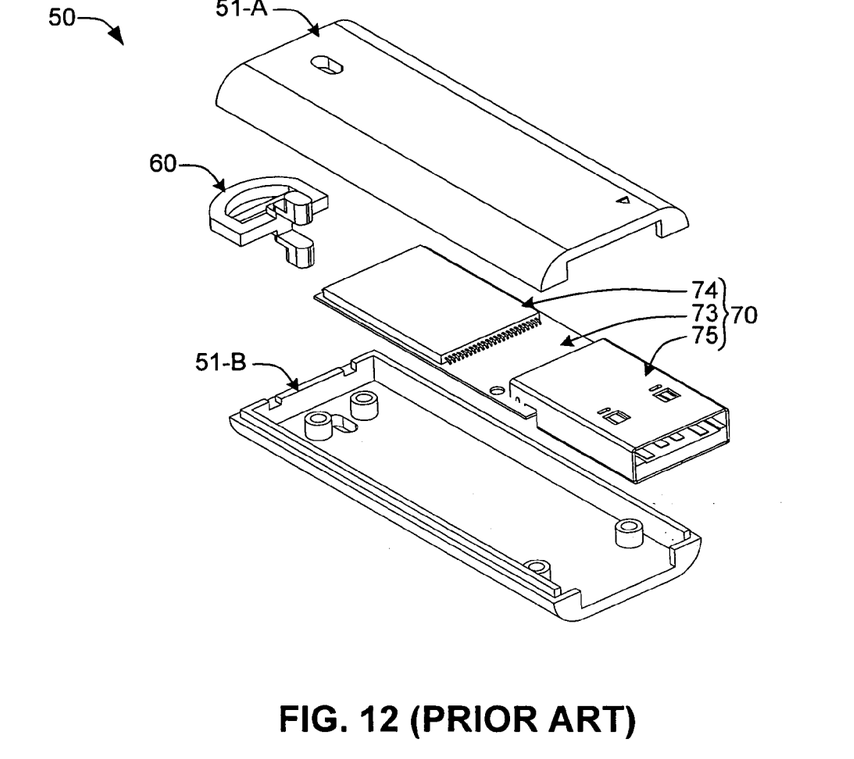
FIG. 12 is an exploded perspective view showing a conventional pen-type computer peripheral device.
Figure 13:
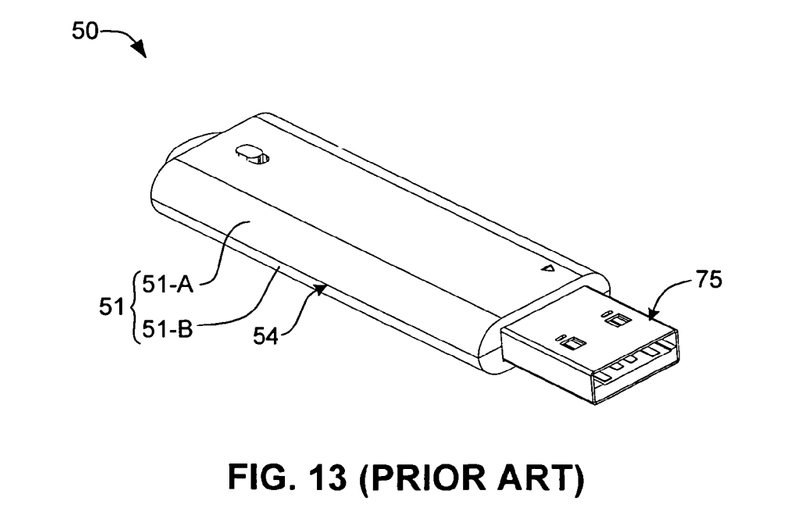
FIG. 13 is a perspective view showing the conventional pen-type computer peripheral device of FIG. 12 in an assembled state.

FIGS. 12 and 13 are exploded perspective and perspective views, respectively, showing a conventional pen-type USB flash drive device 50 provided with a key-chain holder 60. Device 50 includes a housing 51 that encloses a printed circuit board assembly (PCBA) 70 including a printed circuit board (PCB) 73, one or more integrated circuit (IC) devices 74 mounted on PCB 73, and a plug connector 75 mounted on a front end of PCB 73. Housing 51 includes an upper cover 51-A and lower cover 51-B that are assembled using conventional methods such as ultrasonic joining and snap-together. The joining process typically occurs at specific locations along the edges of the covers, and thus the joining is not continuous along the interface. A seam 54 is formed between upper cover 51-A and lower cover 51-B, and becomes the weakest point in the USB flash memory device due to mechanical movement at plug connector 75 during repeated inserting to and removing from an USB socket.

A problem with conventional pen-type peripheral devices that have a two-piece housing is that the two-piece housing can become separated, thereby exposing the PCB and associated electronic devices to damage or contamination. For example, seam 54 (FIG. 13) is prone to break at the joining locations due to repeated insertion of pen-type USB flash drive device 50 into and removal from a USB socket of a host system, thus separating the covers and resulting in failure. Another problem is that the front end of the plastic housing can become damaged by repeated impact with the socket during the insertion process.

What is needed is a pen-type portable computer peripheral device that overcomes the problems associated with conventional structures.

SUMMARY

The present invention is directed to a pen-type portable computer peripheral device including a housing having a front flange structure, a plug connector extending through the front flange structure, and a reinforced (e.g., plastic or metal) connecting ring mounted over the front flange structure such that the housing is reliably secured to the plug connector and protected by the connecting ring.

A method for manufacturing pen-type computer peripheral devices includes manufacturing a PCBA including the plug connector, IC devices and other optional components mounted onto a PCB, and also manufacturing (e.g., plastic molding) a housing that includes either one or two parts (either a tube-like housing or an upper cover and a lower cover that mate together along a seam), and one or more reinforced connecting rings, and an optional plastic cap. The IC devices are operably connected to contact pins of the plug connector such that the IC devices are connected with a host system when the plug connector is plugged into a female socket of the host system. In one embodiment, a two-piece housing includes a lower cover and an upper cover that mate together to collectively form an elongated, substantially rectangular box having a lower wall, an upper wall, and side walls. In another embodiment, the housing is integrally molded as a one-piece rectangular box-like structure that is open at the front end. In both embodiments, the housing also includes a front flange structure that extends from the front end of the lower and upper walls, and surrounds a front opening defined by front edges of the housing walls. In the case of the two-piece housing, the PCBA is mounted inside the lower (or upper) cover with the plug connector extending from the front opening, and then the upper (or lower) cover is mounted to enclose the PCB therein. In the case of the one-piece housing, the PCBA is inserted through the front opening such that side edges of the PCBA are received in and slide along slots formed in the side walls of the housing until a back end of the plug connector is substantially aligned with the front opening. The reinforced collar is then slid over the plug connector, and mounted onto the front flange structure to secure the upper and lower covers together and/or to secure the back end of the plug connector.

According to an aspect of the present invention, the plug connector is a Universal Serial Bus (USB) plug connector having a substantially rectangular cross-section, and the front reinforced connecting ring includes a front plate defining a substantially rectangular central opening that is approximately the same size as the cross-section of the USB plug connector.

According to another aspect of the present invention the front reinforced connecting ring is formed from aluminum or another wear-resistant material, and the front plate of the front reinforced connecting ring is positioned over the front edge of the front flange structure to prevent wear caused by repeated insertion into the socket of a host system.

According to another aspect of the present invention the front reinforced connecting ring and front flange structure of the housing are sized for press-fit (interference) connection. In particular, the collar of the front reinforced connecting ring is formed to include an inner peripheral surface having a resting size that is slightly smaller than the resting size of the front flange structure. Thus, when the front reinforced connecting ring is pressed onto the front flange structure, the collar becomes attached to the front flange structure using interference fit, thereby facilitating a reliable and economical assembly process.

According to another aspect of the present invention the front reinforced connecting ring and the outer wall surfaces of the housing are sized such that an outer surface of the collar is substantially flush with the upper, lower and side walls of the housing when the front reinforced connecting ring is attached to the front flange structure. That is, by providing the front flange structure such that it has a smaller outer peripheral surface than that of the main housing walls, the front reinforced connecting ring can be both mounted using interference fitting techniques and be substantially flush with the housing walls, thereby minimizing the size of the pen-type computer peripheral device. In one specific embodiment, the collar and housing have widths that are less than 19.5 mm, and heights that are less than 9.6 mm, thereby facilitating a high-density socket arrangement.

According to yet another aspect of the present invention, the housing further include a rear flange structure, and the pen-type computer peripheral device further includes a rear reinforced connecting ring having a second collar that is mounted over the rear flange structure. Similar to the reinforced connecting ring attached to the front end, in one embodiment the rear collar of the reinforced connecting ring is sized for interference fitting onto the rear flange structure, and includes a rear plate that extends over a rear end of the housing. Also similar to the front reinforced connecting ring, in one embodiment the rear collar of the reinforced connecting ring is sized to be flush with the outer surfaces of the housing. In another embodiment, both the rear flange structure and the rear plate define one or more rear openings, and an additional structure (e.g., a key-ring holder and/or light pipe) is mounted inside the housing and partially extends through the rear opening.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to pocket-sized, portable computer peripheral devices that are connected by plug connectors (e.g., USB plug connectors) to host computer systems to perform various functions. While the present invention is depicted in particular as a pen-type peripheral (i.e., USB flash drive) device, it should be appreciated that the present invention is applicable to any and all pocket-sized computer peripheral device types that are readily transportable and which may be advantageously interconnected with various host computer systems. Examples of such portable computer peripheral devices include, but are not limited to, flash memory and other data storage devices, communications devices, scanners and cameras. The term "host computer system" is used herein to refer to any electronic computer of any type or size including, but not limited to, desktop computers, notebook computers, palmtop computers and personal digital assistant (PDA) devices. The terms "front", "rear", "upper", and "lower" are used for descriptive purposes here and in the claims, and are intended only to describe relative positions of the recited parts, and are not intended to be limited to positions based on a fixed external reference.

Figure 1:
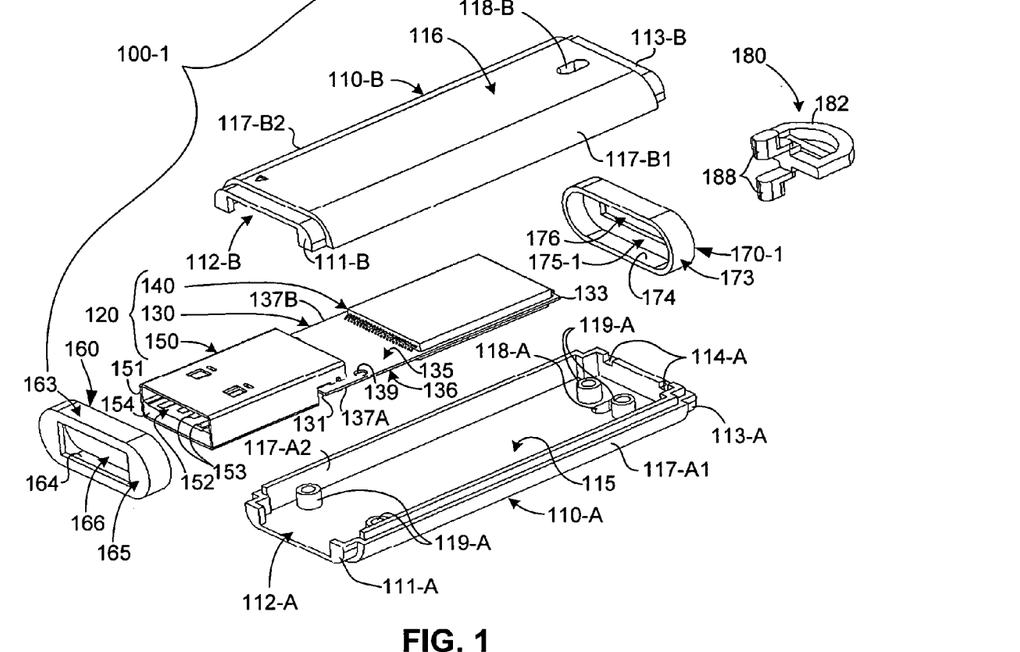
FIG. 1 is an exploded perspective view showing a pen-type computer peripheral device according to an embodiment of the present invention.

FIG. 1 is an exploded perspective view showing a pen-type computer peripheral device 100-1 according to an embodiment of the present invention. Device 100-1 generally includes a housing 110, a printed circuit board assembly (PCBA) 120, a front reinforced connecting ring 160, an optional rear reinforced connecting ring 170-1, and an optional key-holder member 180.

Two-part housing 110 includes a lower cover 110-A and an upper cover 110-B. Base portion 110-A includes a lower wall 115 defining a lower (first) slot 118-A, opposing lower side wall sections 117-A1 and 117-A2, a front flange portion 111-A defining a (first) front opening portion 112-A, and an optional rear flange portion 113-A defining a rear opening portion 114-A. Upper cover 110-B includes an upper wall 116 defining slot 118-B, opposing upper side wall sections 117-B1 and 117-B2, a front flange portion 111-B defining a (second) front opening portion 112-B, and an optional rear flange portion 113-B defining an optional rear opening portion (not shown). Lower side wall sections 117-A1 and 117-A2 include mating structures that receive corresponding mating structures formed on upper side wall sections 117-B2 and 117-B2 such that a tight seam S (shown in FIG. 2) is formed upon assembly. Lower cover 110-A and/or upper cover 110-B also include one or more optional alignment structures (e.g., alignment sockets 119-A formed on lower wall 115 that receive alignment pins extending from the underside surface of upper wall 116) to facilitate assembly.

Referring to the central portion of FIG. 1, PCBA 120 includes a printed circuit board (PCB) 130, at least one integrated circuit (IC) device (electronic device) 140, and a plug connector 150 that are assembled as described below.

PCB 130 is fabricated using standard PCB manufacturing techniques, and, according to an aspect of the present invention, is mounted within the elongated chamber defined by housing 110 in the manner described below. PCB 130 has a front edge 131, a back edge 133, and opposing upper and lower surfaces 135 and 136 that define a width (i.e., extending between opposing side edges 137A and 137B) that is sized to fit within housing 110. Optional alignment features (e.g., openings 139 defined through PCB 130 that receive alignment pins extending from upper wall 116 and engaged in alignment structures 119-A formed on lower wall 115).

At least one IC device 140 (e.g., a controller circuit and/or a memory circuit, or other electronic component) are mounted on or otherwise electrically connected to PCB 120 (e.g., on upper surface 135 and/or lower surface 136) according to well-established techniques to form an electronic circuit. IC device 140 are operably coupled to connection pins formed on plug connector 150 by way of PCB 130 to perform predetermined computer peripheral functions, such as those mentioned above.

Plug connector 150 is mounted onto front end 131 of PCB 130 and includes a front edge 151 defining a socket opening 152 that faces away from PCB 130, and connection pins 153 formed on a substrate 154 and located inside socket opening 151 are generally aligned in the longitudinal direction defined by housing 110. In the disclosed embodiment, plug connector 150 is a Universal Serial Bus (USB) plug connector that is electrically connected to IC device 140 through contacts and conductive traces (not shown) that are formed on PCB 130 using known techniques. As indicated in FIG. 2, when pen-type computer peripheral device 100-1 is fully assembled, plug connector 150 is rigidly supported by and extends from a front end of housing 110 for engagement into a socket of a host system in the manner described below.

Figure 2:
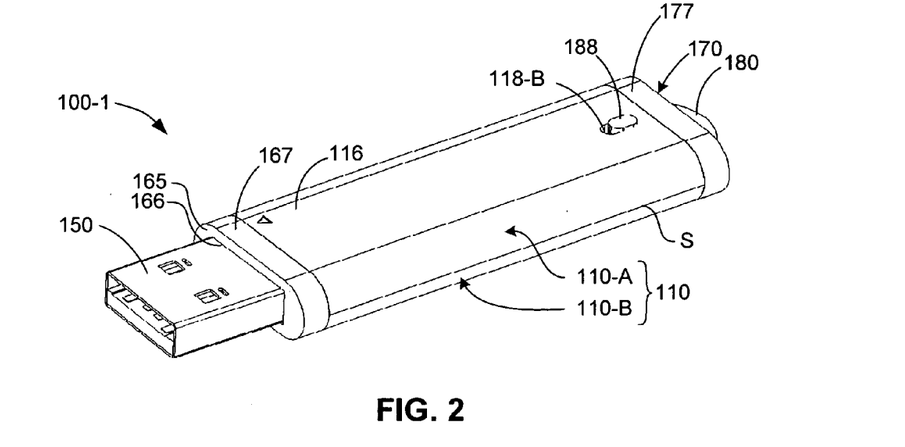
FIG. 2 is a perspective view showing the peripheral device of FIG. 1 in an assembled state.

As indicated in FIGS. 1 and 2, front reinforced connecting ring 160 and optional rear reinforced connecting ring 170-1 are respectively mounted onto the front and rear ends of housing 110. Rings 160 and 170 are formed from metal or another durable, wear-resistant material (e.g., thermoplastic) for reasons that will become clear below. Front reinforced collar 160 includes a hollow (first) collar 163 having an inner peripheral surface 164, and a front plate 165 extending over one end of collar 163 and defining a front central opening 166. Similarly, rear reinforced collar 170 includes a hollow (second) collar 173 having an inner peripheral surface 174, and a rear plate 175 defining a rear central opening 176.

Optional key-chain holder 180 is provided for attaching the device to a key-chain, and includes a loop structure 182 and a pair of engagement protrusions 188. key-chain holder 180 is manufactured, for example, by well-known plastic molding techniques. As indicated in FIG. 2, engagement portions 188 are received in slots 118-A and 118-B, which are formed in lower wall 115 and upper wall 116, respectively, and loop structure 182 extends from the rear end of housing 110 in the manner described below.

Figure 3:
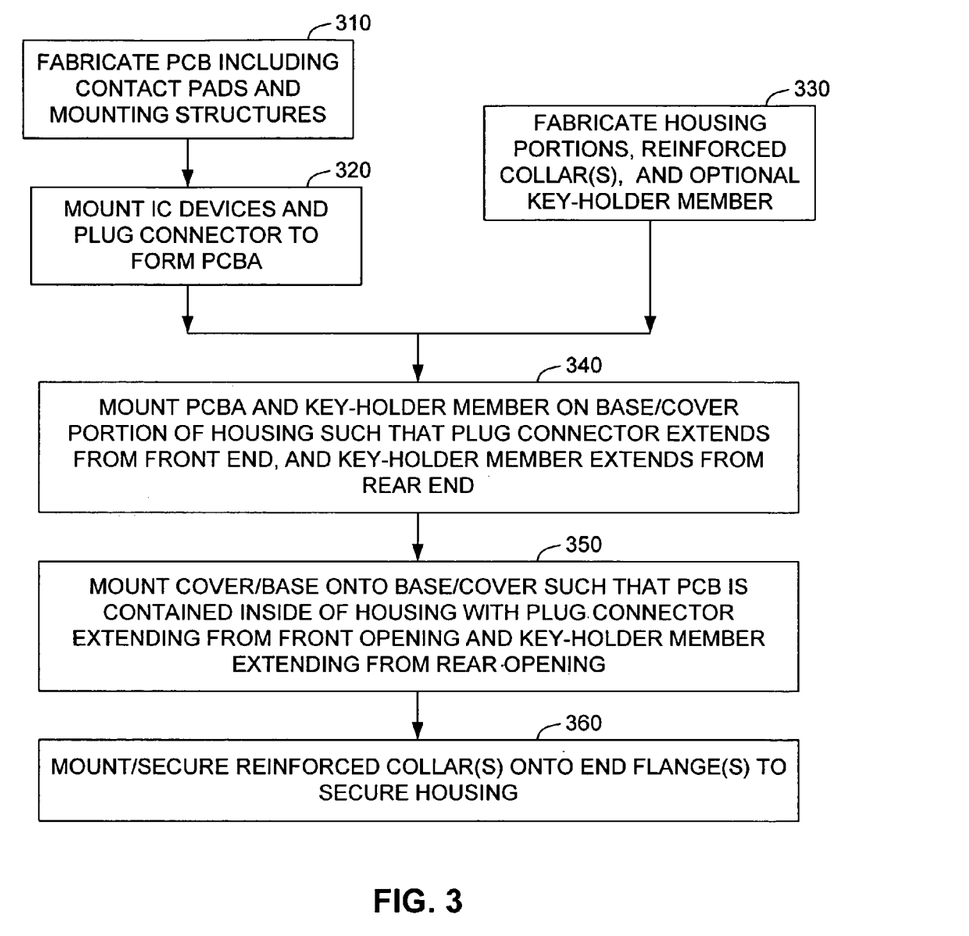
FIG. 3 is a flow diagram showing a method for assembling the pen-type computer peripheral device shown in FIG. 1 according to another embodiment of the present invention.

FIG. 3 is a flow diagram depicting a simplified method for manufacturing pen-type computer peripheral devices according to another embodiment of the present invention. First, a PCB is manufactured according to known PCB fabrication techniques (block 310), and then a plug connector, IC devices and other components are mounted onto the PCB to form a PCBA (block 320). In one embodiment, the PCB is fabricated with alignment holes to facilitate proper alignment during assembly (e.g., through-holes 139 are formed in PCB 130; see FIG. 1), and the fully assembled PCBA includes the plug connector at one end of the PCB (e.g., see PCBA 120, FIG. 1). Concurrent with, before, or after the fabrication of the PCB, the lower and upper covers of the housing and optional key-chain holder are fabricated using, for example, well-known plastic injection molding techniques, and one or more reinforced connecting rings are formed using plastic injection molding, plate metal stamping or other known techniques (block 330). With the components fabricated in this manner, the PCBA and key-holder member are then mounted onto or otherwise secured either the lower cover or upper cover of the housing such that plug connector extends from the front end and the key-holder member extends at least partially from the rear end (block 340). The lower (or upper) cover is then mounted onto the upper/lower cover to enclose the PCB inside (block 350). In one embodiment, the optional key-chain holder is formed with a ring-like connection structure (e.g., loop structure 182; FIG. 1) and also engaging structures (e.g., engagement protrusions 188; FIG. 1) that slidably mate with the slots formed on the upper and lower walls of the housing. For example, as indicated in FIG. 2, one connection post 188 is shown extending through slot 118-B formed in upper wall 116. Finally, the reinforced connecting ring(s) are mounted onto the end flange structure(s) of the housing (block 360). An optional cap, disclosed below, may then be mounted over the plug connector to protect the connector from damage and/or contamination by dust or other material.

FIGS. 4(A) to 4(C) and 5 are simplified cross-sectional side views showing portions of the pen-type computer peripheral device 100-1 during the assembly process described above with reference to FIG. 3.

Figure 4A:
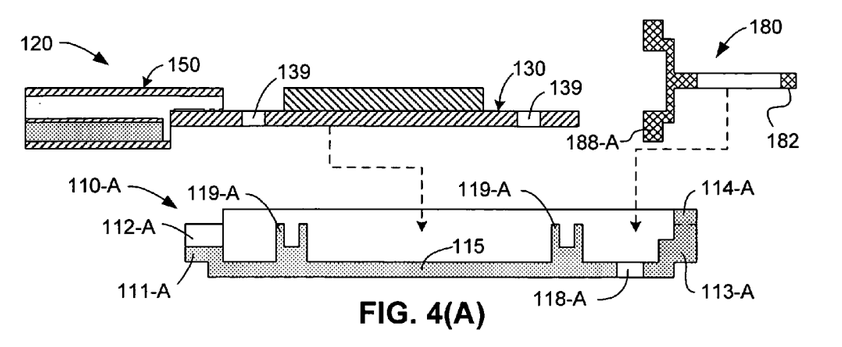
FIGS. 4(A), 4(B) and 4(C) are cross-sectional side views showing portions of the pen-type computer peripheral device during assembly.
Figure 4B:
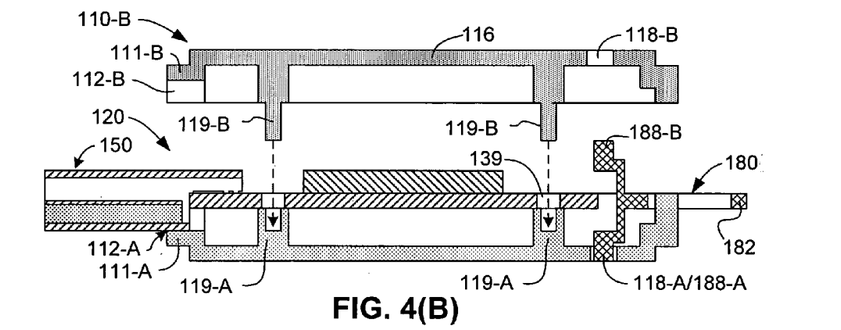

Referring to FIGS. 4(A) and 4(B), PCBA 120 is mounted onto lower cover 110-A such that alignment holes 139 formed in PCB 130 are aligned with alignment structure 119-A provided on lower cover 110-A, and plug connector 150 extends through front opening portion 112-A defined by front flange portion 111-A. At approximately the same time, key-chain holder 180 is mounted on lower cover 110-A such that a lower attachment protrusion 188-A is received in lower slot 118-A, and a portion loop structure 182 extends through rear opening(s) 114-A.

Figure 4C:
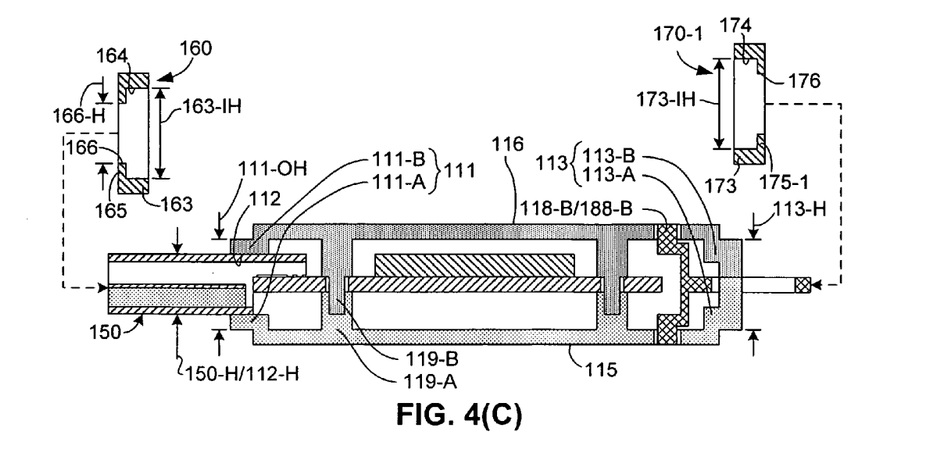

Next, as depicted by FIGS. 4(B) and 4(C), upper cover 110-B is mounted onto lower cover 110-A such that alignment pins 119-B are inserted through alignment holes 139 into alignment structures 119-A, and upper slot 118-B is mounted over upper attachment protrusion 188-B of key-chain holder 180. Note that front flange portion 111-B mates onto front flange portion 111-A to form a two-part front flange structure 111 (indicate in FIG. 4(C)), and, similarly, rear flange portion 113-B mates onto rear flange portion 113-A to form rear flange structure 113.

Figure 5:
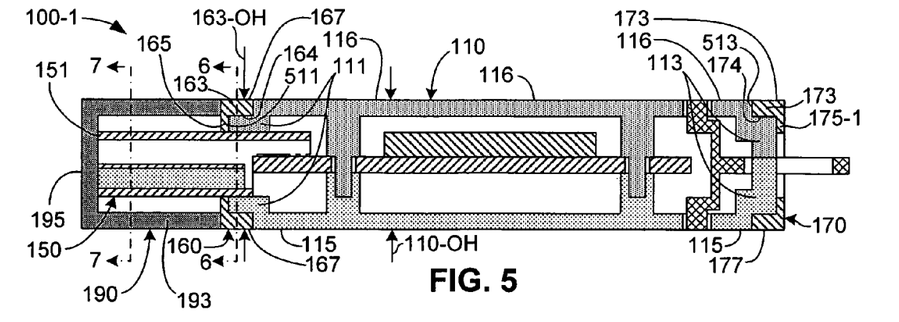
FIG. 5 is a cross-sectional side view showing the pen-type computer peripheral device after assembly is completed.

Next, as indicated in FIGS. 4(C) and 5, front reinforced connecting ring 160 is slid over plug connector 150 and mounted onto front flange structure 111, and rear reinforced connecting ring 170-1 is slid over loop structure 182 and mounted onto rear flange structure 113. In addition, as shown in FIG. 5, front collar 160 and rear collar 170 include inner surfaces 164 and 174 that are sized to fit over flange structures 111 and 113, respectively, such that the edges of collars 163 and 173 contact lower wall 115 and upper wall 116 when inside surfaces of front wall 165 and rear wall 175 contact end surfaces 511 and 513 of front flange structure 111 and rear flange structure 113, respectively.

According to an aspect of the invention, the size of front opening 112 through front flange structure 111 and the size of opening 166 through front reinforced connecting ring 160 are sized to fit closely around the perimeter of plug connector 150. In one embodiment, plug connector 150 is a USB plug connector having a substantially rectangular cross-section that is sized according to well-established standards, and front opening 112 has a size that is slightly larger than the external surface height of the USB plug connector 150 (e.g., as shown in FIG. 4(C), central opening 112 through front flange structure 111 has a height 112-H that is slightly larger than a height 150-H of plug connector 150). Similarly, central opening 166 through front plate 165 is substantially rectangular and is sized approximately the same (e.g., slightly larger) as plug connector 150 (e.g., a height 166-H of front opening 166 is slightly larger than height 150-H of plug connector 150). This close fit both provides stability to plug connector 150 and helps resist contaminants from entering housing 110.

Referring again to FIG. 4(C), according to another aspect of the present invention, front reinforced connecting ring 160 and front flange structure 111 are sized such that collar 163 is attached to front flange structure 111 by interference (press) fit techniques. In particular, collar 163 of front reinforced connecting ring 160 is formed to include an inner peripheral surface having a resting size (e.g., height 163-IH; shown in FIG. 4(C)) that is slightly smaller than the resting size (e.g., height 111-OH) of front flange structure 111. Thus, when front reinforced connecting ring 160 is pressed onto front flange structure 111, collar 163 becomes attached to front flange structure 111 using interference fit, thereby facilitating a reliable and economical assembly process.

Similar to front reinforced connecting ring 160, rear reinforced connecting ring 170 and rear flange structure 113 (when used) are sized such that collar 173 is attached to rear flange structure 113 by interference (press) fit techniques. In particular, collar 173 of rear reinforced connecting ring 170 is formed to include an inner peripheral surface having a resting size (e.g., height 173-IH; shown in FIG. 4(C)) that is slightly smaller than the resting size (e.g., height 113-H) of rear flange structure 113. Thus, when rear reinforced connecting ring 170 is pressed onto rear flange structure 113, collar 173 becomes attached to rear flange structure 113 using interference fit.

Figure 6:
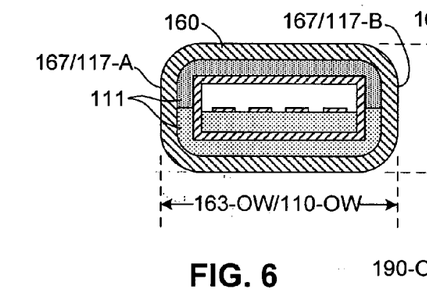
FIG. 6 is a cross-sectional end view showing the pen-type computer peripheral device taken along section line 6—6 of FIG. 5.

FIG. 5 is a cross-sectional side view showing pen-type computer peripheral device 100-1 in a fully assembled state, and FIG. 6 is a cross-sectional view taken along section line 6—6 of FIG. 5.

Referring to FIGS. 5 and 6, according to another aspect of the present invention, an outer surface 167 of front reinforced connecting ring 160 and the outer wall surfaces of housing 110 are sized such that outer surface 167 is substantially flush with lower wall 115 and upper wall 116 (as indicated in FIG. 5), and is also flush with side walls 117-A/117-B of housing 110 when front reinforced connecting ring 160 is mounted onto front flange structure 111. For example, as shown in FIGS. 5 and 6, an outer height 163-OH of collar 163 is substantially equal to an outer height 110-OH of housing 110, and aligned such that the outer surface 167 of collar 163 is coplanar with lower wall 115. Similarly, as indicated in FIG. 6, an outer width 163-OW of collar 163 is substantially equal to an outer width 110-OW of housing 110, and aligned such that the outer surface of collar 163 is coplanar with the side walls of housing 110. By providing front flange structure 111 such that it has a smaller outer peripheral surface than that of the main housing walls, front reinforced connecting ring 160 can be both mounted using the interference fitting techniques mentioned above and be substantially flush with the housing walls, thereby minimizing the size of the pen-type computer peripheral device.

Similar to front reinforced connecting ring 160, rear collar 173 of reinforced connecting ring 170 (when used) is sized such that outer surface 177 is flush with the outer surfaces of housing 110.

Figure 7:
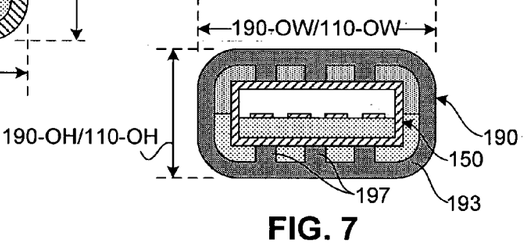
FIG. 7 is a cross-sectional end view showing the pen-type computer peripheral device taken along section line 7—7 of FIG. 5.

Returning to FIG. 5, an optional cap 190 mounted over plug connector 150 to protect it from contamination when not inserted into a host socket. As indicated in FIG. 5, cap 190 includes side walls 193 and an end plate 195 that abuts front edge 151 of plug connector 150 when cap 190 is mounted. FIG. 7 is a cross-sectional end view taken along section line 7—7 of FIG. 5, and shows cap 190 in additional detail. As shown, several ribs 197 extend from side walls 193 to contact the upper and lower walls of plug connector 150. As also shown, similar to the connecting rings, cap 190 is sized to be flush with housing 110 (e.g., an outside height 190-OH of cap 190 is substantially equal to outside height 110-OH of housing 110, and an outside width 190-OW of cap 190 is substantially equal to outside height 110-OW of housing 110). Note that even though the ribs 197 are illustrated to protrude vertically from the upper and lower sidewalls 193 to contact the upper and lower walls of the plug connector 150, in reality, the protruding direction need not be restricted. For example, the ribs can be designed to protrude horizontally from the left and right sidewalls 193 to contact the left and right walls of plug connector 150 to further secure the cap when used.

Figure 8:
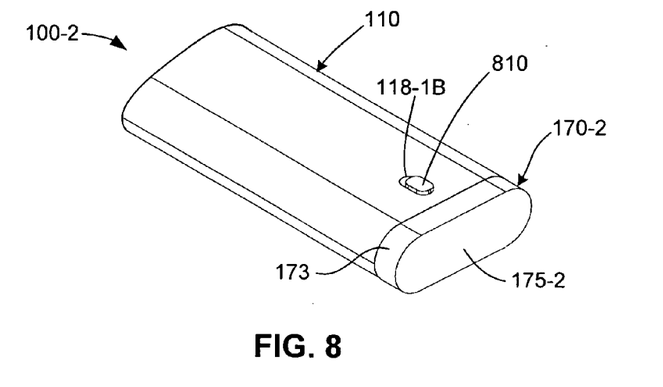
FIG. 8 is a partial rear perspective view showing a pen-type computer peripheral device according to another embodiment of the present invention.

FIG. 8 is a partial rear perspective view showing a pen-type computer peripheral device 100-2 according to another embodiment of the present invention. Device 100-2 is similar to device 100-1 (described above) in that it includes a rear reinforced connecting ring 170-2 having a collar 173 attached to a rear flange structure of housing 110 in the manner described above. However, device 100-2 differs from device 100-1 in that rear reinforced connecting ring 170-2 includes a solid rear plate 175-2 (i.e., rear plate 175-2 does not include an opening), and includes an indicator light 810 extending through slot 118-1B formed in upper wall 115 of housing 110. Indicator light 810 (e.g., a light-emitting diode (LED) light-pipe coupled to the IC devices mounted on the PCBA) functions to indicate to the user when device 100-2 is properly engaged in a female socket, and when data are being transferred. In yet another embodiment (not shown), an indicator light may be exposed through a rear opening similar to that provided by rear reinforced connecting ring 170-1 (discussed above).

Figure 9:
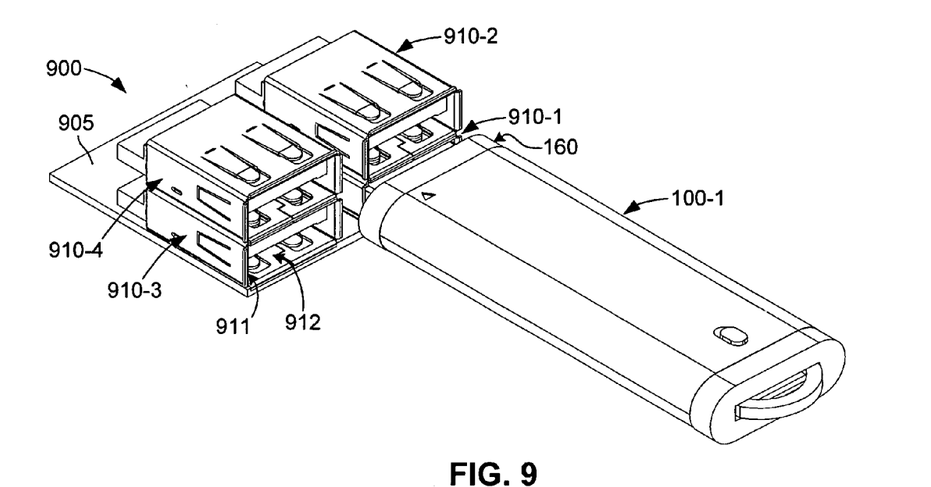
FIG. 9 is a rear perspective view showing a pen-type computer peripheral device and associated socket arrangement according to another embodiment of the present invention.
Figure 10A:
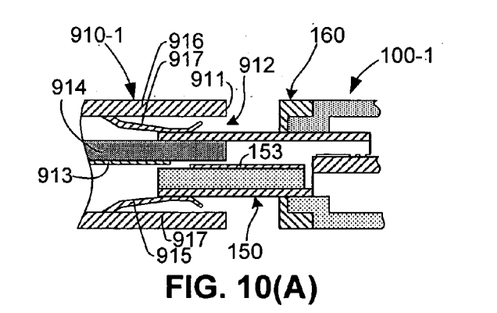
FIGS. 10(A) and 10(B) are partial cross-sectional side views showing a portion of a pen-type computer peripheral device as it is inserted into a socket of the assembly shown in FIG. 9.
Figure 10B:
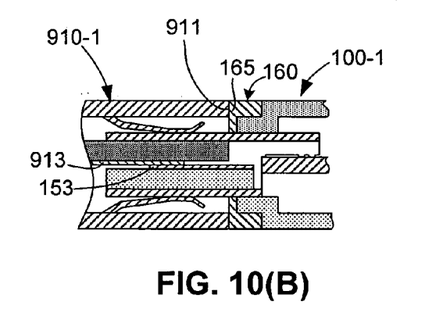
Figure 11:
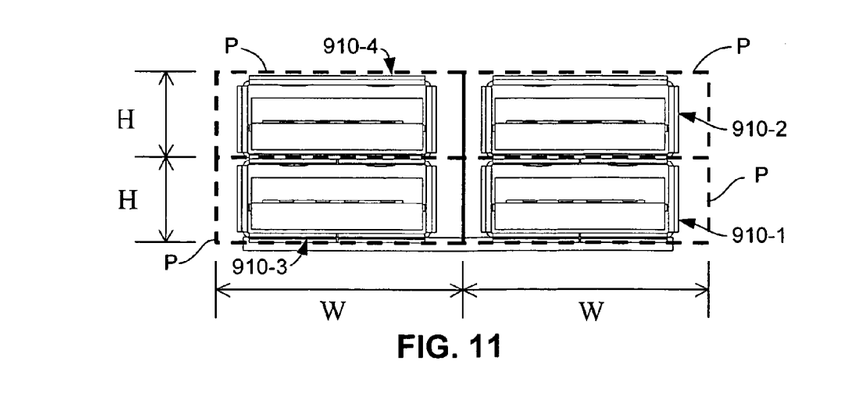
FIG. 11 is a front view showing the socket assembly of FIG. 9.

FIGS. 9 through 11 illustrate pen-type computer peripheral device 100-1 engaged with a corresponding portion of a host system 900. Host system 900 includes a circuit board 905, and four female-type socket structures 910-1 through 910-4 mounted on circuit board 905. Host system 900 also includes control electronics (not shown) that communicate with one or more pen-type computer peripheral device mounted in socket structures 910-1 through 910-4 according to known methods.

FIGS. 10(A) and 10(B) illustrate the front ends of socket structure 910-1 and pen-type computer peripheral device 100-1 during insertion. Socket structure 910-1 includes a front edge 911 defining a socket opening 912, and connection pins 913 formed on a substrate 914. Socket structure 910-1 also includes lower and upper walls 915 and 916 that include guide members 917 that serve to properly position the front end of plug connector 150 during insertion in the manner shown in FIG. 10(A). As indicated in FIGS. 10(A) and 10(B), when plug connector 150 becomes fully inserted into socket structure 910-1, connection pins 153 make contact with connection pins 913, thereby facilitating communication between the host system and pen-type computer peripheral device 100-1.

According to another aspect of the present invention, as indicated in FIG. 10(B), front wall 165 of front reinforced connecting ring 160 provides protection against wear due to contact between the front end of pen-type computer peripheral device 100-1 and front edge 911 of socket structure 910-1. That is, in conventional structures that do not include a reinforced connecting ring made from wear resistant material, repeated contact between front edge 911 of socket structure 910-1 and the front edge of the plastic device housing can result in wear and/or failure of the housing.

According to another aspect of the present invention, an assembly is provided in which socket structures 910-1 through 910-4 are arranged in a predetermined optimal pattern, and pen-type computer peripheral device 100-1 is sized according to the predetermined optimal pattern, thereby providing a highly space-efficient arrangement. As indicated in FIG. 11, in one specific embodiment, a maximum external profile P (indicated by dashed lines) of each device 100-1, which corresponds to the external surface size of collar 173 and housing 110, is set to a width W that is less than 19.5 mm, and a height H that are less than 9.6 mm, thereby facilitating the high-density socket arrangement. Note that socket structures 910-1 through 910-4 are arranged according to the maximum external profile so a plurality of the USB flash memory devices can be connected simultaneously to the host in a very tight space, such as a notebook computer.

Figure 14:
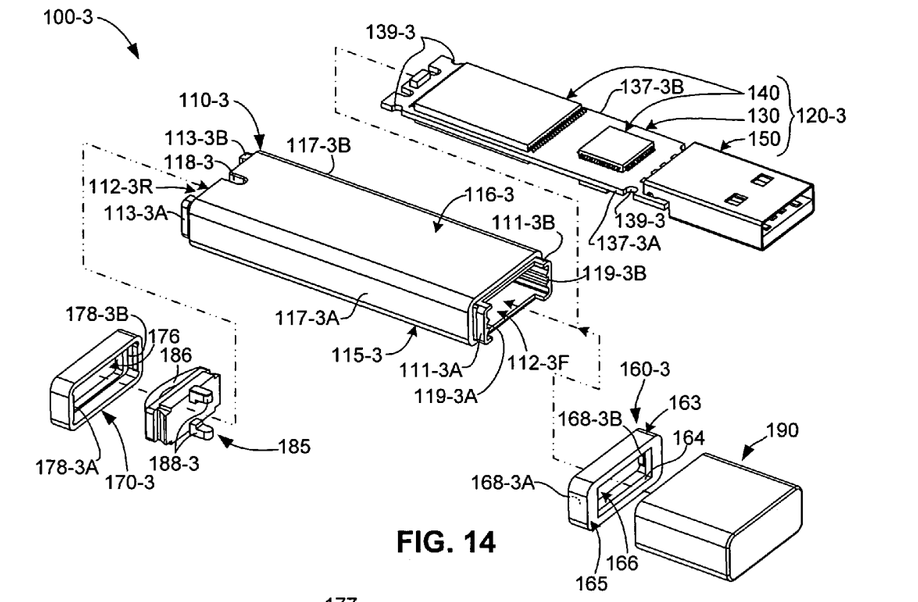
FIG. 14 is an exploded perspective view showing a pen-type computer peripheral device according to another embodiment of the present invention.
Figures 15A, 15B:
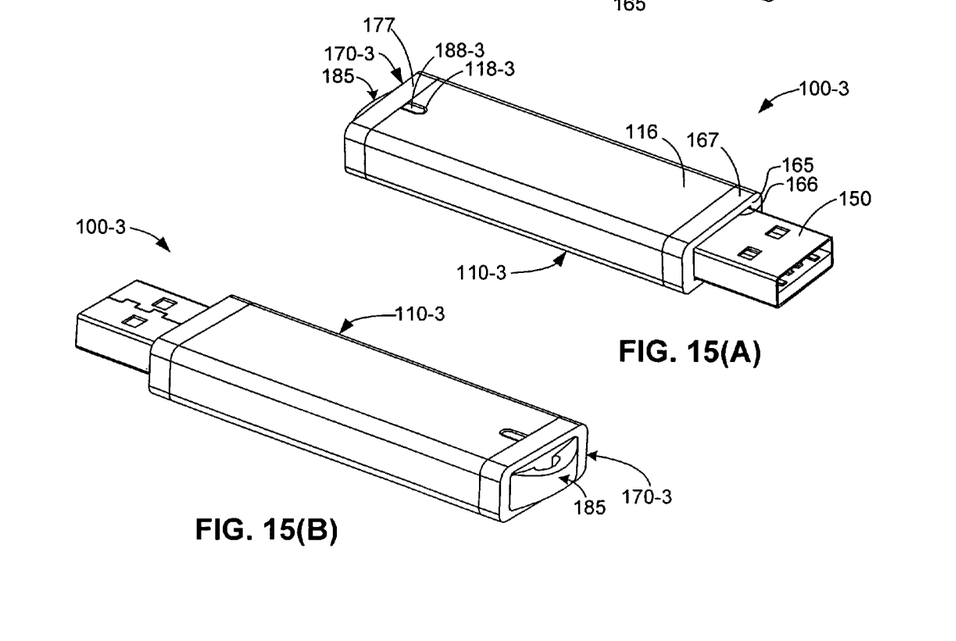
FIGS. 15(A) and 15(B) are front and rear perspective views showing the peripheral device of FIG. 14 in an assembled state.

FIGS. 14, 15(A) and 15(B) are an exploded perspective view and assembled perspective views, respectively, showing a pen-type computer peripheral device 100-3 according to yet another embodiment of the present invention. As indicated in FIG. 14, device 100-3 is similar to device 100-1 (described above) in that it includes a PCBA 120-3, a front reinforced connecting ring 160-3, an optional rear reinforced connecting ring 170-3, an optional cap 190, and an optional key-ring holder and/or light-pipe device 185. However, device 100-3 differs from device 100-1 in the following respects.

In accordance with a first aspect of the present embodiment, instead of a two-part housing, device 100-3 includes an integrally molded (one-piece) housing 110-3 in which lower wall 115-3 and upper wall 116-3 are rigidly and permanently connected by opposing side walls 117-3A and 117-3B. The phrase "integrally molded" is intended to indicate that housing 110-3 is formed entirely during a single molding step in which, for example, plastic is injected into a mold cavity having portions such that lower wall 115, upper wall 116 and opposing side walls 117-3A and 117-3B are produced substantially concurrently. Opposing front and rear edges of walls 115, 116, 117-3A and 117-3B define a front opening 112-3F and an optional rear opening 112-3R, respectively. As described in additional detail below, by forming housing 110-3 in a single piece, assembly of device 100-3 is simplified. Further, the use of a seamless single-piece housing 110-3 generates a stronger overall structure that better protects PCBA 120-3 and provides an esthetically desirable appearance.

Figure 16:
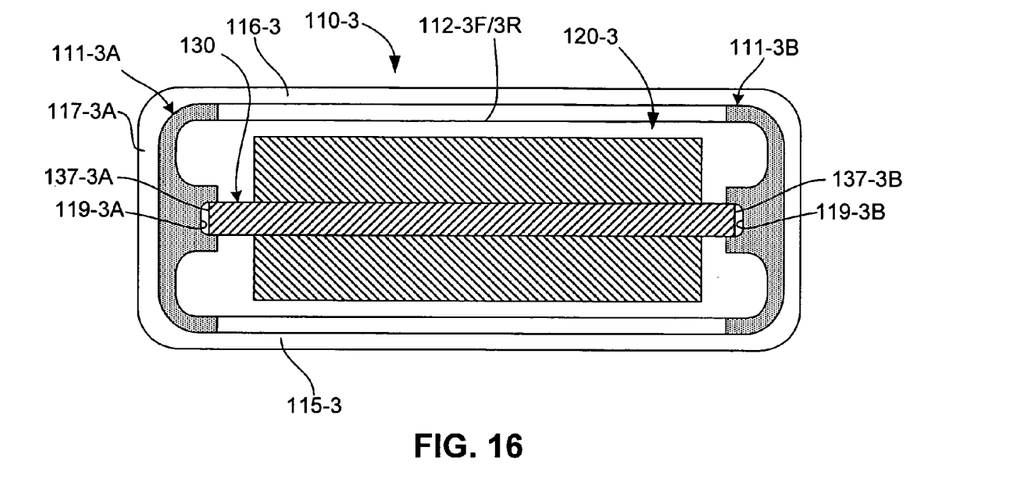
FIG. 16 is a simplified cross-sectional end view showing a front end portion of a one-piece housing of the peripheral device of FIG. 14.

In accordance with another aspect of the present embodiment, the inside surfaces of side walls 117-3A and 117-3B respectively define slots 119-3A and 119-3B that extend between front opening 112-3F and rear opening 112-3R. As indicated by the single-dot-dashed line in FIG. 14, during assembly, PCBA 120-3 is inserted through front opening 112-3F. As indicated in FIG. 16, during this assembly process, slots 119-3A and 119-3B receive side edges of PCB 130, thereby securing PCBA 120-3 inside housing 110-3 between lower wall 115, upper wall 116 and opposing side walls 117-3A and 117-3B. Referring again to FIG. 14, notches 139-3 are formed on the side edges 137-3A and 137-3B of PCB 130, allowing an optional two-part (upper and lower) housing (not shown, similar to housing 110 in FIG. 1) with corresponding protrusions (not shown) to be utilized, thereby securing PCBA 120-3 inside.

Figure 17A:
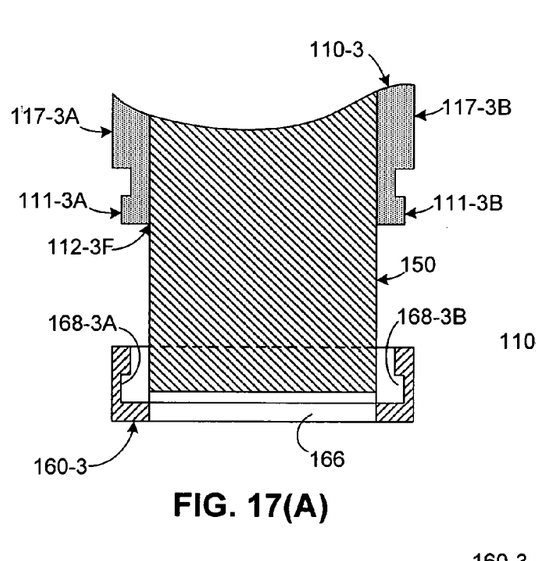
FIGS. 17(A) and 17(B) are simplified cross-sectional top views showing the front end portion of the peripheral device of FIG. 14 during assembly of the front reinforced connecting ring.
Figure 17B:
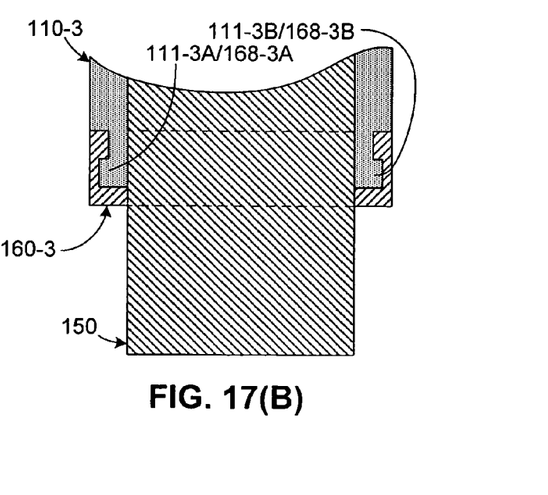

In accordance with another aspect of the present embodiment, front flange portions 111-3A and 111-3B are formed on opposing side walls 117-3A and 117-3B adjacent to front opening 112-3F, and rear flange portions 113-3A and 113-3B are formed on opposing side walls 117-3A and 117-3B adjacent to rear opening 112-3R. In addition, a collar 165-3 of front connecting ring 160-3 is provided with engaging grooves 168-3A and 168-3B that snap-couple (engage) with front flange portions 111-3A and 111-3B to secure front connecting ring 160-3 onto housing 110-3. Specifically, as depicted in FIG. 14 by the double-dot-dashed line, after the PCBA is inserted into housing 110-3 such that plug connector 150 extends from front opening 112-3F, front connecting ring 160-3 is mounted over plug connector 150 (i.e., such that plug connector 150 passes through opening 166), and slid down plug connector 150 until front connecting ring 160-3 encounters front flange portions 111-3A and 111-3B. This process is also depicted in FIGS. 17(A) and 17(B), which show plug connector 150 as it is mounted over plug connector 150. After sliding along plug connector 150, an addition force is applied to cause front flange portions 111-3A and 111-3B to snap-couple into engaging grooves 168-3A and 168-3B, as depicted in FIG. 17(B). Front connecting ring 160-3 thus provides protection to the front end of housing 110-3 in the manner described above, and also helps to rigidly maintain the base (rear) end of plug connector 150 against housing 110-3. Note that, as in previous embodiments, an outer peripheral surface of collar 165-3 is sized such that it is substantially flush with the outer peripheral surface of housing 110-3.

Optional key-ring holder and/or light-pipe device 185 is mounted over rear opening 112-3R and secured by rear connecting ring 170-3 in a manner similar to that described above with reference to front reinforcing ring 160-3. In particular, after PCBA 120-3 is inserted into housing 110-3, key-ring holder and/or light-pipe device 185 is mounted over rear opening 112-3R such that engagement protrusions 188-3 are received in slots 118-3 (one shown), which are formed in lower and upper walls 115 and 116. Connecting ring 170-3 is then mounted over key-ring holder and/or light-pipe device 185 and snap-coupled onto rear flange portions 113-3A and 113-3B in a manner similar to that described above. As indicated in FIG. 15(B), a portion of key-ring holder and/or light-pipe device 185 extends through opening 176 of rear connecting ring 170-3 after assembly is completed.

Figure 18:
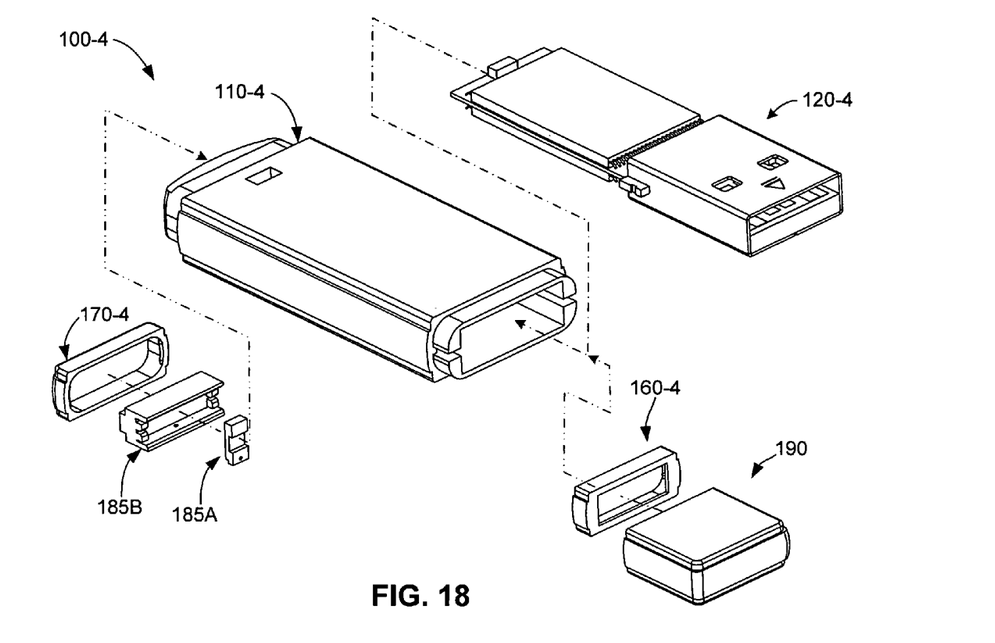
FIG. 18 is an exploded perspective view showing a pen-type computer peripheral device according to another embodiment of the present invention.
Figures 19A, 19B:
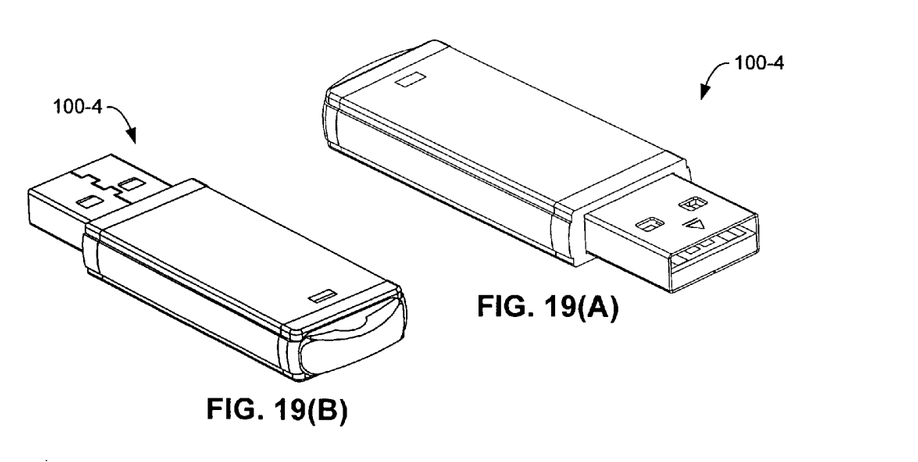
FIGS. 19(A) and 19(B) are front and rear perspective views showing the peripheral device of FIG. 18 in an assembled state.

FIGS. 18, 19(A) and 19(B) are an exploded perspective view and assembled perspective views, respectively, showing a pen-type computer peripheral device 100-4 according to yet another embodiment of the present invention. As indicated in FIG. 18, device 100-4 is similar to device 100-3 (described above) in that it includes a one-piece housing 110-4, PCBA 120-4, a front reinforced connecting ring 160-4, an optional rear reinforced connecting ring 170-4, an optional cap 190, and an optional key-ring holder and/or light-pipe device assembly including a light-pipe 185A and a key-ring and/or light-pipe holder 185B. Device 100-4 differs from device 100-3 in that the size of housing 110-4 and PCBA 120-4 is reduced.

While the present invention has been described above with reference to several specific embodiments, these embodiments are intended to be exemplary and not limiting. For example, although the described embodiments include an IC and a plug connector mounted on a PCB, in another embodiment a rigid substrate may be utilized to support only the plug connector and the positioning member, with the IC (or other electronic device) mounted separately in the housing and coupled to the plug connector by, for example, a flexible cable.

The invention claimed is:

1. A portable computer peripheral apparatus comprising:
   an elongated housing including a lower wall, an upper wall, and side walls extending between the lower wall and the upper wall, wherein the lower, upper and side walls define a front opening, and wherein the housing further includes at least one front flange mounted on at least one of the lower, upper and side walls adjacent to the front opening;
   a printed circuit board assembly (PCBA) including a printed circuit board (PCB) mounted inside of the housing, at least one of a controller circuit and a memory circuit mounted on the PCB, and a plug connector mounted onto a front end of the PCB; and
   a front reinforced connecting ring attached to the front flange structure of the housing, the front reinforced connecting ring including a first collar surrounding and defining a central opening,
   wherein the PCBA is mounted inside the housing such that said at least one of said controller circuit and said memory circuit is located between the upper and lower walls, and such that the plug connector extends from the front opening of the housing and through the central opening of the front reinforced connecting ring.

2. The portable computer peripheral apparatus according to claim 1, wherein the lower, upper and side walls comprise an integrally molded structure.

3. The portable computer peripheral apparatus according to claim 1,
   wherein the housing further comprises slots defined on inside surfaces of the side walls, and
   wherein the PCBA is mounted inside the housing such that side edges of the PCB are received in the slots.

4. The portable computer peripheral apparatus according to claim 1, wherein the front reinforced connecting ring is snap-coupled onto the front flange structure.

5. The portable computer peripheral apparatus according to claim 1, wherein the plug connector is a Universal Serial Bus (USB) plug connector having a substantially rectangular cross-section, and wherein the front reinforced connecting ring includes a front plate, and wherein the central opening defined by the front plate is rectangular and approximately the same size as the cross-section of the USB plug connector.

6. The portable computer peripheral apparatus according to claim 1, wherein the first collar has an outer peripheral surface defining a first external size, wherein the housing has a second external peripheral surface defining a second external size, and wherein the first external size is substantially equal to the second external size such that the outer peripheral surface of the first collar is substantially flush with the outer peripheral surface of the housing.

7. The portable computer peripheral apparatus according to claim 1, wherein the housing further comprises at least one rear flange mounted on at least one of the lower, upper and side walls adjacent to a rear opening defined by the lower, upper and side walls, and wherein the apparatus further comprises a rear reinforced connecting ring including a second collar surrounding the rear flange structure of the upper and lower covers.

8. The portable computer peripheral apparatus according to claim 7, wherein the rear reinforced connecting ring is snap-coupled onto the rear flange structure.

9. The portable computer peripheral apparatus according to claim 8, wherein the rear reinforced connecting ring includes a rear plate formed on the second collar such that the rear plate extends over a rear edge of the rear flange structure.

10. The portable computer peripheral apparatus according to claim 9, wherein the rear plate defines a rear central opening.

11. The portable computer peripheral apparatus according to claim 10, further comprising at least one of a key-ring holder and a light-pipe device extending through the rear central opening defined by the rear plate.

12. The portable computer peripheral apparatus according to claim 7, wherein the second collar has an outer peripheral surface defining a first external size, and wherein the housing has a second external peripheral surface defining a second external size, and wherein the first external size is substantially equal to the second external size such that the outer peripheral surface of the second collar is substantially flush with the outer peripheral surface of the housing.

13. A method for manufacturing a pen-type computer peripheral apparatus including a housing having a lower wall, an upper wall, and side walls extending between the lower wall and the upper wall collectively forming a front opening, and including a front flange structure formed on at least one of the lower wall, the upper wall and the side walls adjacent to the front opening, the pen-type computer peripheral apparatus also including a plug connector extending from the housing, the method comprising:
   mounting a printed circuit board assembly (PCBA) inside the housing, wherein the PCBA includes a printed circuit board (PCB), at least one of a controller circuit and a memory circuit mounted on the PCB, and the plug connector mounted onto a front end of the PCB; and
   mounting a front reinforced connecting ring over the plug connector such that the front reinforced connecting ring is coupled onto the front flange and surrounds at least a portion of the plug connector.

14. The method according to claim 13, wherein mounting the front reinforced connecting ring comprises snap-coupling the front reinforced connecting ring onto the front flange structure.

15. The method according to claim 13, wherein the housing defines a rear opening and further includes a rear flange structure formed on at least one of the lower wall, the upper wall and the side walls adjacent to the rear opening; and wherein the method further comprises mounting a rear reinforced connecting ring onto the rear flange structure.

16. The method according to claim 15, wherein mounting the rear reinforced connecting ring comprises snap-coupling the rear reinforced connecting ring onto the rear flange structure.

17. The method according to claim 15, wherein the rear reinforced connecting ring includes a rear plate defining a rear central opening aligned with the rear opening of the housing, and wherein the method further comprises mounting at least one of a key-ring and a light-pipe structure inside of the housing such that a portion of the key-ring and/or light-pipe structure extends through the rear opening of the housing and the rear central opening of the rear reinforced connecting ring.

* * * * *